United States Patent
Choi et al.

(10) Patent No.: US 11,833,806 B2
(45) Date of Patent: Dec. 5, 2023

(54) DISPLAY DEVICE

(71) Applicant: Samsung Display Co., LTD., Yongin-si (KR)

(72) Inventors: Dong Won Choi, Seoul (KR); Beon Jin Kim, Asan-si (KR); Jin Hwan Choi, Seoul (KR); Tae Woong Kim, Seongnam-si (KR); Jong Hwa Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/398,545

(22) Filed: Aug. 10, 2021

(65) Prior Publication Data

US 2022/0141968 A1 May 5, 2022

(30) Foreign Application Priority Data

Nov. 4, 2020 (KR) .......................... 10-2020-0146153

(51) Int. Cl.
*G09F 9/30* (2006.01)
*G06F 1/16* (2006.01)
(Continued)

(52) U.S. Cl.
CPC ................ *B32B 7/12* (2013.01); *B32B 3/085* (2013.01); *B32B 3/16* (2013.01); *B32B 5/142* (2013.01); *B32B 5/147* (2013.01); *B32B 37/26* (2013.01); *G06F 1/1652* (2013.01); *G09F 9/301* (2013.01); *B32B 3/266* (2013.01); *B32B 27/283* (2013.01); *B32B 27/40* (2013.01); *B32B 37/14* (2013.01);
(Continued)

(58) Field of Classification Search
None
See application file for complete search history.

(56) References Cited

U.S. PATENT DOCUMENTS 9,940,892 B2 4/2018 Pang
10,014,352 B1 * 7/2018 Tsai ..................... H10K 50/844
(Continued)

FOREIGN PATENT DOCUMENTS

CN 104134660 A * 11/2014 ............ H01L 27/02
CN 106328599 A * 1/2017 ............ H01L 23/14
(Continued)

OTHER PUBLICATIONS

Machine Translation of CN-108564885-A, Sep. 2018 (Year: 2018).*
(Continued)

*Primary Examiner* — Jeffrey A Vonch
(74) *Attorney, Agent, or Firm* — KILE PARK REED & HOUTTEMAN PLLC

(57) ABSTRACT

A display device includes a display panel; a supporter disposed on a surface of the display panel; and an adhesive layer disposed between the supporter and the display panel, wherein the supporter includes metal layers spaced apart from each other; and a cushion layer surrounding the metal layers, the adhesive layer includes a first area overlapping the metal layers in a vertical direction to the display panel; and a second area not overlapping the metal layers in the vertical direction to the display panel, and a modulus of the second area of the adhesive layer is larger than a modulus of the first area of the adhesive layer.

14 Claims, 9 Drawing Sheets

(51) Int. Cl.
  *B32B 3/08*   (2006.01)
  *B32B 3/24*   (2006.01)
  *B32B 5/14*   (2006.01)
  *B32B 7/12*   (2006.01)
  *B32B 37/14*  (2006.01)
  *B32B 38/00*  (2006.01)
  *B32B 3/16*   (2006.01)
  *B32B 37/26*  (2006.01)
  *B32B 37/12*  (2006.01)
  *H05K 1/02*   (2006.01)
  *G02F 1/1333* (2006.01)
  *B32B 3/26*   (2006.01)
  *B32B 27/40*  (2006.01)
  *B32B 27/28*  (2006.01)

(52) U.S. Cl.
  CPC ... *B32B 38/0008* (2013.01); *B32B 2037/1253* (2013.01); *B32B 2037/266* (2013.01); *B32B 2260/021* (2013.01); *B32B 2260/046* (2013.01); *B32B 2262/106* (2013.01); *B32B 2305/72* (2013.01); *B32B 2305/74* (2013.01); *B32B 2307/51* (2013.01); *B32B 2307/54* (2013.01); *B32B 2307/56* (2013.01); *B32B 2310/0831* (2013.01); *B32B 2311/00* (2013.01); *B32B 2311/24* (2013.01); *B32B 2311/30* (2013.01); *B32B 2457/20* (2013.01); *G02F 1/133305* (2013.01); *G06F 1/1641* (2013.01); *G06F 2203/04102* (2013.01); *H05K 1/028* (2013.01); *H05K 2201/05* (2013.01); *H05K 2201/051* (2013.01); *H05K 2201/10128* (2013.01); *Y10T 428/24322* (2015.01); *Y10T 428/24331* (2015.01); *Y10T 428/24339* (2015.01); *Y10T 428/24942* (2015.01); *Y10T 428/24983* (2015.01)

(56) References Cited

U.S. PATENT DOCUMENTS

| | | | |
|---|---|---|---|
| 2008/0018631 A1* | 1/2008 | Hioki | G02F 1/133526 345/206 |
| 2008/0042940 A1* | 2/2008 | Hasegawa | H10K 59/17 345/55 |
| 2008/0055831 A1* | 3/2008 | Satoh | G02F 1/133305 361/600 |
| 2010/0073620 A1* | 3/2010 | Yamaguchi | G02F 1/133305 313/511 |
| 2014/0099479 A1* | 4/2014 | Krall | H04M 1/0269 428/174 |
| 2014/0226275 A1* | 8/2014 | Ko | G06F 1/1652 361/679.27 |
| 2014/0295150 A1* | 10/2014 | Bower | C09J 5/00 428/411.1 |
| 2015/0004345 A1* | 1/2015 | Chaung | C09J 5/06 428/189 |
| 2015/0055287 A1* | 2/2015 | Seo | G06F 1/1641 361/679.27 |
| 2015/0102296 A1* | 4/2015 | Kim | H10K 50/844 438/34 |
| 2015/0181731 A1* | 6/2015 | Lin | H05K 1/028 361/679.01 |
| 2015/0314561 A1* | 11/2015 | Kim | B32B 27/08 156/60 |
| 2015/0370287 A1* | 12/2015 | Ko | H04M 1/0268 361/749 |
| 2015/0378391 A1* | 12/2015 | Huitema | H05K 1/183 361/679.03 |
| 2016/0014883 A1* | 1/2016 | Cho | H10K 77/111 361/749 |
| 2016/0218305 A1* | 7/2016 | Kim | H10K 59/124 |
| 2016/0227623 A1* | 8/2016 | Yoo | H05B 33/10 |
| 2016/0231843 A1* | 8/2016 | Kim | G06F 3/041 |
| 2016/0255713 A1* | 9/2016 | Kim | G09F 9/301 361/749 |
| 2016/0357052 A1* | 12/2016 | Kim | H10K 50/84 |
| 2016/0364055 A1* | 12/2016 | Huh | G09G 5/00 |
| 2017/0092884 A1* | 3/2017 | Zhang | G06F 1/1652 |
| 2017/0188471 A1* | 6/2017 | Fan | G06F 1/1601 |
| 2017/0229522 A1* | 8/2017 | Cai | G06F 3/0445 |
| 2017/0229665 A1* | 8/2017 | Park | H10K 77/111 |
| 2017/0263890 A1* | 9/2017 | Chun | H10K 50/844 |
| 2017/0271616 A1* | 9/2017 | Choi | H01L 51/0097 |
| 2017/0309843 A1* | 10/2017 | Kim | B32B 3/266 |
| 2018/0097197 A1* | 4/2018 | Han | H05K 5/03 |
| 2018/0150108 A1* | 5/2018 | Song | G06F 1/1677 |
| 2018/0190936 A1* | 7/2018 | Lee | B32B 15/04 |
| 2018/0192527 A1* | 7/2018 | Yun | G09F 9/301 |
| 2018/0253175 A1* | 9/2018 | Yao | G06F 3/0445 |
| 2018/0304575 A1* | 10/2018 | Liu | H10K 77/111 |
| 2018/0373297 A1* | 12/2018 | Liao | G06F 1/1681 |
| 2019/0044078 A1* | 2/2019 | Chen | H10K 50/844 |
| 2019/0082528 A1* | 3/2019 | Zhang | H10K 59/12 |
| 2019/0098774 A1* | 3/2019 | Park | H05K 5/0017 |
| 2019/0098775 A1* | 3/2019 | Cho | H10K 50/86 |
| 2019/0132987 A1* | 5/2019 | Koo | H05K 7/18 |
| 2019/0141843 A1* | 5/2019 | Park | H10K 50/841 |
| 2019/0157609 A1* | 5/2019 | Suzuki | H10K 50/841 |
| 2019/0179193 A1* | 6/2019 | Kang | G02F 1/133345 |
| 2019/0191543 A1* | 6/2019 | Han | H10K 50/844 |
| 2019/0196548 A1* | 6/2019 | Kim | G06F 1/1681 |
| 2019/0198783 A1* | 6/2019 | Kim | H01L 51/0097 |
| 2019/0207141 A1* | 7/2019 | Kim | H01L 51/56 |
| 2019/0214586 A1* | 7/2019 | Li | H10K 59/12 |
| 2019/0305232 A1* | 10/2019 | Chen | H10K 77/111 |
| 2020/0008308 A1* | 1/2020 | Shin | H05K 5/0017 |
| 2020/0051881 A1* | 2/2020 | Park | B32B 3/04 |
| 2020/0059733 A1* | 2/2020 | Shin | H01L 41/37 |
| 2020/0084897 A1* | 3/2020 | Shin | H05K 5/0017 |
| 2020/0147923 A1* | 5/2020 | Shi | B32B 1/00 |
| 2020/0166970 A1* | 5/2020 | Yeom | G06F 1/1618 |
| 2020/0194698 A1* | 6/2020 | Zhai | H01L 23/562 |
| 2020/0203642 A1* | 6/2020 | Kim | B32B 15/092 |
| 2020/0212327 A1* | 7/2020 | Park | H10K 77/111 |
| 2020/0241594 A1* | 7/2020 | Cavallaro | B32B 7/12 |
| 2020/0280005 A1* | 9/2020 | Fang | G09F 9/30 |
| 2020/0319043 A1* | 10/2020 | Rosenberg | B32B 15/18 |
| 2020/0344897 A1* | 10/2020 | Kim | G06F 1/1641 |
| 2021/0068276 A1* | 3/2021 | Kim | H05K 5/0017 |
| 2021/0086469 A1* | 3/2021 | Cosgrove | H10K 77/111 |
| 2021/0104694 A1* | 4/2021 | Yee | H10K 59/12 |
| 2021/0141419 A1* | 5/2021 | Wang | G06F 1/203 |
| 2021/0149448 A1* | 5/2021 | Cao | G06F 1/1652 |
| 2021/0151697 A1* | 5/2021 | Cao | H10K 50/841 |
| 2021/0165447 A1* | 6/2021 | Wang | G06F 1/1616 |
| 2021/0165454 A1* | 6/2021 | Dong | G06F 1/1652 |
| 2021/0168929 A1* | 6/2021 | Wang | H05K 1/028 |
| 2021/0174709 A1* | 6/2021 | Xiang | H05K 1/028 |
| 2021/0191459 A1* | 6/2021 | Kim | G06F 1/1637 |
| 2021/0201710 A1* | 7/2021 | Kim | G06F 1/1616 |
| 2021/0208636 A1* | 7/2021 | Kim | B32B 27/281 |
| 2021/0227704 A1* | 7/2021 | Bi | B32B 15/20 |
| 2021/0233447 A1* | 7/2021 | Park | G06F 1/1616 |
| 2021/0337686 A1* | 10/2021 | Sim | H04M 1/0268 |
| 2021/0407329 A1* | 12/2021 | Hu | H10K 77/111 |
| 2021/0408405 A1* | 12/2021 | Hu | H10K 77/111 |
| 2022/0005386 A1* | 1/2022 | Kim | G06F 1/1652 |
| 2022/0036771 A1* | 2/2022 | Peng | G09G 3/32 |
| 2022/0101761 A1* | 3/2022 | Gao | G09F 9/301 |
| 2022/0198966 A1* | 6/2022 | Park | G06F 1/1601 |
| 2022/0206537 A1* | 6/2022 | Park | G06F 3/044 |
| 2022/0293870 A1* | 9/2022 | Park | H10K 77/111 |
| 2022/0312602 A1* | 9/2022 | Wang | B32B 3/266 |
| 2022/0354003 A1* | 11/2022 | Liu | B32B 1/00 |
| 2022/0393121 A1* | 12/2022 | Gu | H10K 77/111 |
| 2022/0399521 A1* | 12/2022 | Kang | B32B 15/20 |

(56) References Cited

U.S. PATENT DOCUMENTS

| | | | | |
|---|---|---|---|---|
| 2023/0034440 A1* | 2/2023 | Xie | ............... | G06F 1/1616 |
| 2023/0154360 A1* | 5/2023 | Zhao | ................ | G06F 3/0412 |
| | | | | 361/749 |
| 2023/0157147 A1* | 5/2023 | Wang | ............ | H10K 77/111 |
| | | | | 361/807 |

FOREIGN PATENT DOCUMENTS

| | | | | | |
|---|---|---|---|---|---|
| CN | 107230429 A | * | 10/2017 | ............ | G09F 9/301 |
| CN | 107437378 A | * | 12/2017 | ............ | G09F 9/301 |
| CN | 107554017 A | * | 1/2018 | | |
| CN | 108230907 A | * | 6/2018 | ............ | G09F 9/301 |
| CN | 108257982 A | * | 7/2018 | ......... | H01L 27/1218 |
| CN | 108564885 A | * | 9/2018 | ............ | G06F 3/041 |
| CN | 109036132 A | * | 12/2018 | ............ | G09F 9/301 |
| CN | 109360498 A | * | 2/2019 | | |
| CN | 109360499 A | * | 2/2019 | ............ | G09F 9/301 |
| CN | 109616021 A | * | 4/2019 | ............ | G09F 9/301 |
| CN | 109980124 A | * | 7/2019 | | |
| CN | 110649087 A | * | 1/2020 | ............ | G09F 9/301 |
| CN | 110827693 A | * | 2/2020 | ............ | G09F 9/301 |
| CN | 111081150 A | * | 4/2020 | ............ | G09F 9/301 |
| CN | 111091762 A | * | 5/2020 | | |
| CN | 111414050 A | * | 7/2020 | .......... | G06F 1/1616 |
| CN | 215068979 U | * | 12/2021 | | |
| JP | 2016018198 A | * | 2/2016 | | |
| KR | 10-2016-0104808 | | 9/2016 | | |
| KR | 2017038599 A | * | 4/2017 | ......... | H01L 27/3246 |
| KR | 10-2017-0095636 | | 8/2017 | | |
| KR | 2020006223 A | * | 1/2020 | ............ | G09F 9/301 |
| KR | 10-2020-0030265 | | 3/2020 | | |
| KR | 10-2020-0063801 | | 6/2020 | | |
| WO | WO-2022070316 A1 | * | 4/2022 | | |

OTHER PUBLICATIONS

Gyu-Seong Shim et al., "Preparation of acrylic pressure sensitive adhesives by UV/UV step curing as a way of lifting the limitations of conventional dual curing techniques", International Journal of Adhesion and Adhesives, 2020, pp. 1-8, vol. 96, 102445.

* cited by examiner

DISPLAY DEVICE

CROSS-REFERENCE TO RELATED APPLICATION(S)

This application claims priority to and benefits of Korean Patent Application No. 10-2020-0146153 under 35 U.S.C. § 119 filed on Nov. 4, 2020 in the Korean Intellectual Property Office, the entire contents of which are incorporated herein by reference.

BACKGROUND

(a) Technical Field

The disclosure relates to a display device, and, to a display device that prevents deformation in a rollable display device.

(b) Description of the Related Art

Recently, with the development of display related technologies, display devices having structures which may be modified during use, such as being folded, rolled in a roll form, and stretched like a rubber band, have been researched and developed. Since these display devices may be modified in various forms and ways, they may satisfy both a demand for a large-size display and a demand for a small-size, portable display.

When the display device is folded or rolled, stress is applied to constituent elements of the display device. This stress may cause damage to a display panel and deteriorate display quality.

The above information disclosed in this background section is only for enhancement of understanding of the background of the disclosure, and therefore it may contain information that does not form the prior art that may already be known to a person of ordinary skill in the art.

SUMMARY

Embodiments provide a display device that may prevent deformation of the display device in a rollable display device.

An embodiment provides a display device that may include a display panel; a supporter disposed on a surface of the display panel; and an adhesive layer disposed between the supporter and the display panel, wherein the supporter may include metal layers spaced apart from each other; and a cushion layer surrounding the metal layers, the adhesive layer may include a first area overlapping the metal layers in a vertical direction to the display panel; and a second area not overlapping the metal layers in the vertical direction to the display panel, and a modulus of the second area of the adhesive layer may be larger than a modulus of the first area of the adhesive layer.

A difference between the modulus of the second area and the modulus of the first area may be about 2 times to about 10 times.

The first area and the second area may include a same material, and may have different moduli.

The metal layers may include stainless steel, aluminum, or a carbon composite material.

A modulus of the metal layers may be in a range of about 1 GPa to about 1000 GPa.

The cushion layer may include silicone or urethane.

A module of the cushion layer may be in a range of about 1 KPa to about 1000 KPa.

A cross-sectional shape each of the metal layers in the vertical direction to the display panel may be substantially quadrangular.

A cross-sectional shape of each the metal layers in the vertical direction to the display panel may be substantially trapezoidal in which a side positioned away from the display panel may be longer than other sides.

A cross-sectional shape of each of the metal layers in the vertical direction to the display panel may be substantially trapezoidal in which a side positioned closer to the display panel may be longer than other sides.

A width of the second area of the adhesive layer may be same as a shortest distance between adjacent ones of the metal layers.

The display panel may be rollable.

The display device may further include a roller on which the display panel may be rolled; and a housing part that accommodates the roller and the display panel rolled on the roller.

The adhesive layer may be a pressure sensitive adhesive.

An embodiment provides a manufacturing method of a display device that may include applying an adhesive layer including a first area and a second area on a display panel; disposing a supporter on the adhesive layer and attaching the display panel and the supporter by the adhesive layer; and curing a portion of the adhesive layer by irradiating ultraviolet irradiation from a surface of the supporter, wherein the supporter may include metal layers spaced apart from each other, and a cushion layer surrounding the metal layers.

The metal layers may be used as a mask in the irradiating of the ultraviolet irradiation from the surface of the supporter.

In the irradiating of the ultraviolet irradiation may comprise curing the second area of the adhesive layer that does not overlap the metal layers in a vertical direction to the display to increase a modulus of the second area of the adhesive layer.

A modulus of the second area of the adhesive layer that does not overlap the metal layers in the vertical direction to the display panel may be larger than a modulus of the first area overlapping the metal layers in the vertical direction to the display panel.

A difference between the modulus of the second area and the modulus of the first area may be about 2 times to about 10 times.

A cross-sectional shape of each of the metal layers in a vertical direction the display panel may be substantially quadrangular.

According to embodiments, a rollable display device that prevents deformation of a display device during a rolling process is provided.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
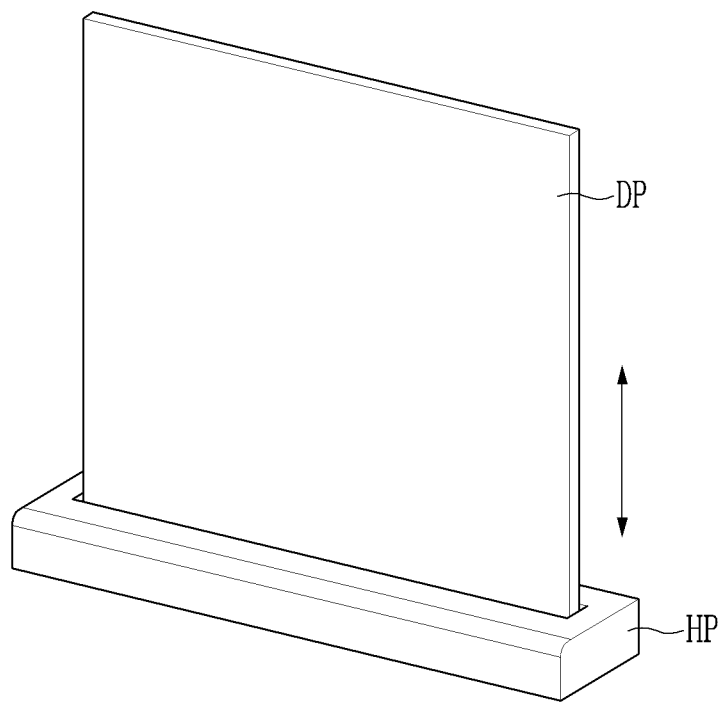
FIG. 1 illustrates a perspective view of a display device according to an embodiment.

The disclosure will be described more fully hereinafter with reference to the accompanying drawings, in which embodiments are shown. As those skilled in the art would appreciate, the described embodiments may be modified in various different ways, all without departing from the spirit or scope of the disclosure.

In order to clearly describe the disclosure, parts that may be irrelevant to the description may be omitted, and identical or similar constituent elements throughout the specification are denoted by the same reference numerals.

Further, in the drawings, the size and thickness of each element are arbitrarily illustrated for ease of description, and the disclosure is not necessarily limited to those sizes and thicknesses of elements illustrated in the drawings. In the drawings, the thicknesses of layers, films, panels, regions, areas etc., are exaggerated for clarity. In the drawings, for ease of description, the thicknesses of some layers and areas are exaggerated.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

It will be understood that when an element such as a layer, film, region, area or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

For example, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

In addition, unless explicitly described to the contrary, the word "comprise" and variations such as "comprises" or "comprising", "include", "includes", or "including", "has", "have", or "having" and variations thereof will be understood to imply the inclusion of stated elements but not the exclusion of any other elements.

Further, throughout the specification, the phrase "in a plan view" or "on a plane" means viewing a target portion from the top, and the phrase "in a schematic cross-sectional view" or "on a cross-section" means viewing a cross-section formed by vertically cutting a target portion from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device according to an embodiment will be described with reference to the accompanying drawings.

FIG. 1 illustrates a perspective view of a display device according to an embodiment. Referring to FIG. 1, a display device according to an embodiment may include a display part DP and a housing part HP. The display part DP is a component that displays an image or images to a user, and may include a display element, and a circuit and wire for driving the display element. As shown in FIG. 1, the display device according to an embodiment may be a rollable display device, and the display part DP may be rolled or unrolled.

The housing part HP is a housing in which the display part DP may be accommodated. The display part DP may be rolled to be accommodated in the housing part HP, and unrolled to display an image or images at the outside of the housing part HP.

Figure 2:
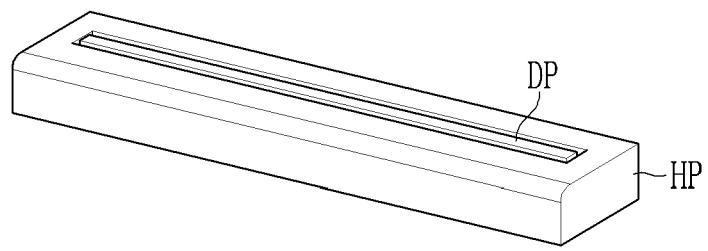
FIG. 2 illustrates a state in which a display part is rolled and accommodated in a housing part.
Figure 3:
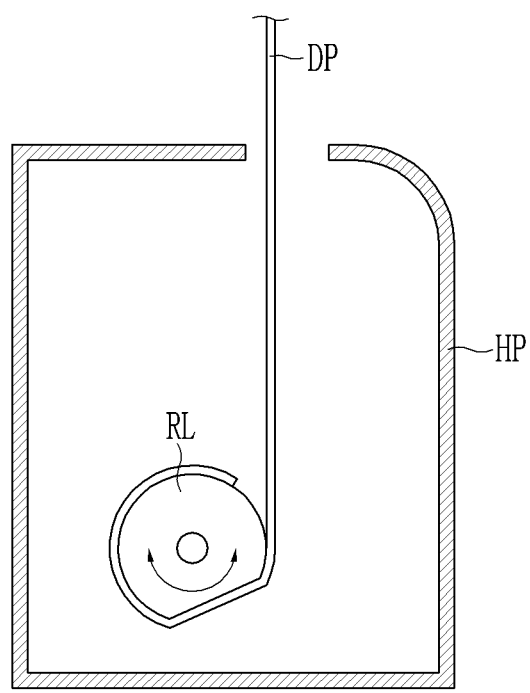
FIG. 3 illustrates a process in which a display part is rolled or unrolled by a roller positioned inside of a housing part.

FIG. 1 illustrates a state in which the display part DP is unrolled. FIG. 2 illustrates a state in which the display part DP is rolled to be accommodated in the housing part HP. FIG. 3 illustrates a process in which the display part DP is rolled or unrolled by a roller RL positioned or disposed inside of the housing part HP. As shown in FIG. 3, the roller RL is positioned or disposed inside of the housing part HP, and the display part DP may be properly positioned or disposed according to a use environment while being rolled or unrolled on the roller RL. In case that the display part DP is fully rolled on the roller RL, as shown in FIG. 2, the display part DP may be accommodated in the housing part HP. In case that the display part DP is fully unrolled from the roller RL, as shown in FIG. 1, the display part DP may be positioned or disposed outside of the housing part HP to be able to display an image or images.

As shown in FIG. 1 to FIG. 3, since the display part DP of the rollable display device is rolled or unrolled on the roller RL, it should be flexible. Hereinafter, a detailed structure of the display part DP according to an embodiment will be described in detail with reference to the drawings.

Figure 4:
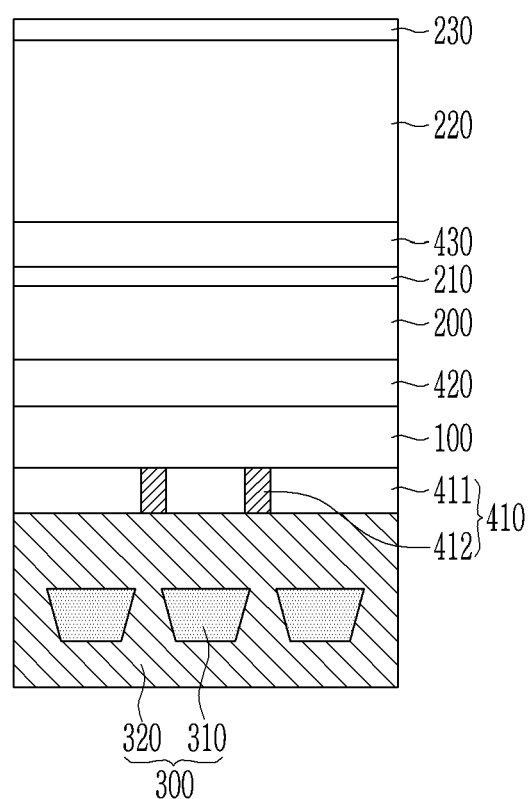
FIG. 4 illustrates a schematic cross-sectional view of a display part according to an embodiment.

FIG. 4 schematically illustrates a schematic cross-sectional view of a display part DP according to an embodiment. Referring to FIG. 4, the display part DP may include a display panel 100, a window 200, a first coating layer 210, a passivation film 220, a second coating layer 230, a supporter 300, and a first adhesive layer 410, a second adhesive layer 420, and a third adhesive layer 430 that bond respective elements. The supporter 300 may include a plurality of metal layers 310 and a cushion layer 320 surrounding the metal layers 310.

The display panel 100 may include a plurality of transistors and light emitting elements electrically connected thereto. The display panel 100 may be attached to the window 200 by the second adhesive layer 420. The second adhesive layer 420 may be an optically clear adhesive (OCA). The first coating layer 210 may be disposed on the window 200, and the first coating layer 210 may be a hard coating layer.

The passivation film 220 may be disposed on the first coating layer 210. The second coating layer 230 may be disposed on the passivation film 220. The second coating layer 230 may be a hard coating layer or fingerprint-resistant layer.

The supporter 300 may include the plurality of metal layers 310 spaced apart from each other, and the cushion layer 320 surrounding the metal layers 310. As shown in FIG. 4, the metal layers 310 may have a substantially trapezoidal cross-sectional shape. As such, when the metal layer or layers 310 has or have a substantially trapezoidal cross-sectional shape, the display portion DP may be easily rolled or unrolled.

The metal layer 310 may include stainless steel (SUS), aluminum, or a carbon composite material, but is not limited thereto. A Young's modulus of the metal layer 310 may be in a range of about 1 GPa to about 1000 GPa.

The cushion layer 320 may include silicone or urethane, but is not limited thereto. A Young's modulus of the cushion layer 320 may be in a range of about 1 KPa to about 1000 KPa.

The supporter 300 may be disposed on a surface of the display panel 100 and may be bonded to the display panel 100 with a first adhesive layer 410. The first adhesive layer 410 may be a pressure sensitive adhesive (PSA).

The first adhesive layer 410 may include a first area 411 and a second area 412. The first area 411 may be an area that overlaps surfaces of the metal layer 310 and the display panel 100 in a substantially vertical direction, while the second area 412 may be an area that does not overlap the surfaces of the metal layer 310 and the display panel 100 in the substantially vertical direction.

Figure 8:
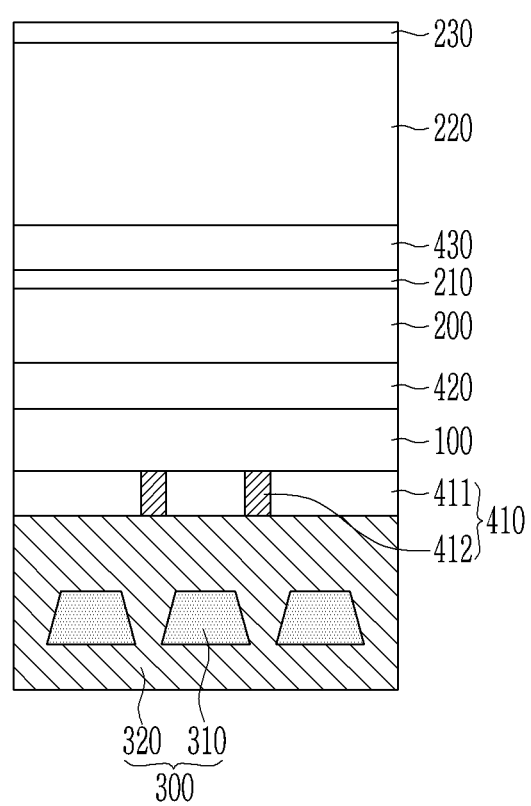
FIG. 8 illustrates a similar schematic cross-sectional view as FIG. 4 for a display device according to an embodiment.
Figure 9:
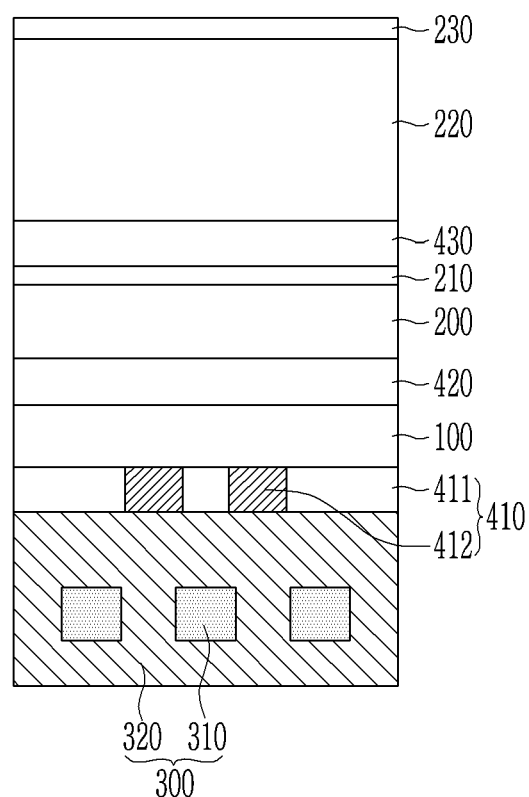
FIG. 9 illustrates a similar schematic cross-sectional view as FIG. 4 for an embodiment.

Moduli of the first area 411 and the second area 412 may be different. For example, the modulus of the second area 412 may be about 2 to 10 times higher than that of the first area 411. The first area 411 and the second area 412 may include the same material or similar material, and the second area 412 may have a higher modulus due to a difference in an amount of ultraviolet (UV) irradiation during a manufacturing process. As described above, since the second area 412 that does not overlap the metal layer 310 has a higher modulus than that of the first area 411 to be rigid, it is possible to prevent deformation thereof in a spaced area between the metal layers 310 during a rolling process of the display part DP. In FIGS. 4, 8, and 9, for example, a width of the second area 412 may be the same as a shortest distance between the plurality of metal layers 310 adjacent to each other.

Figure 5:
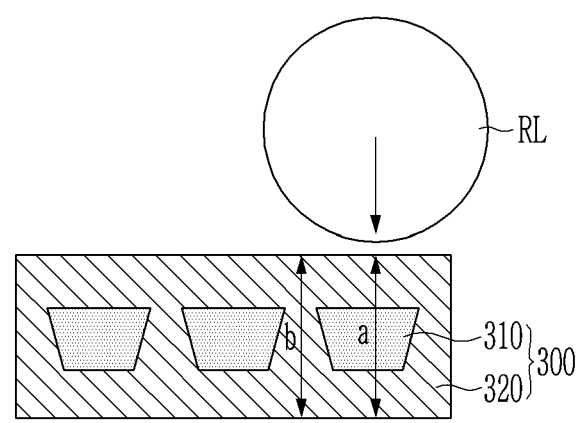
FIG. 5 illustrates stress applied to each area of a supporter when a display panel is rolled by a roller.

FIG. 5 illustrates stress applied to each area of the supporter 300 in case that the display panel is rolled by the rollers RL. As shown in FIG. 5, when a rolling operation is performed by the roller RL, a stress in the arrow direction is applied to the supporter 300. In an area (a) where the metal layer 310 may be disposed, a structure thereof may be maintained by the rigid metal layer 310, but in an area (b) where the metal layer 310 may not be disposed and the cushion layer 320 may be disposed, the cushion layer 320 may be deformed.

Figure 6:
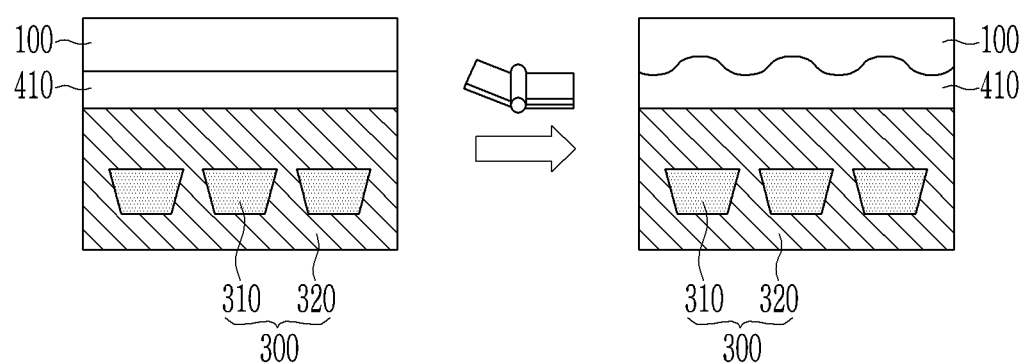
FIG. 6 illustrates shapes of a display panel, a first adhesive layer, and a supporter before and after being rolled on a roller.

FIG. 6 illustrates shapes of the display panel 100, the first adhesive layer 410, and the supporter 300 before and after being rolled on the roller RL. Referring to FIG. 6, after being rolled on the roller RL, the cushion layer 320 having elasticity is restored to its original shape, but the first adhesive layer 410 is not restored to its original shape. The deformation of the cushion layer 320 in which the metal layer 310 may not be disposed causes the deformation of the first adhesive layer 410 in the corresponding area. The cushion layer 320 may be restored to its original shape by elasticity, but the first adhesive layer 410 may be permanently deformed, and the deformation of the first adhesive layer 410 may be viewed from an upper portion of the display panel 100 to degrade display quality.

However, in the display device according to an embodiment, as shown in FIG. 4, since the first adhesive layer 410 where the deformation occurs has a higher modulus than other areas, it is possible to prevent the deformation of the first adhesive layer 410 in the rolling process.

Since the deformation of the first adhesive layer 410 may occur in the second area 412 that does not overlap the metal layer 310, the modulus of the second area 412 may be set to be higher than that of the first area 411. Therefore, since the deformation of the cushion layer 320 is prevented by the rigid second area 412, even if the cushion layer 320 is deformed during the rolling process, it is possible to prevent the first adhesive layer 410 from being deformed.

Figure 7:
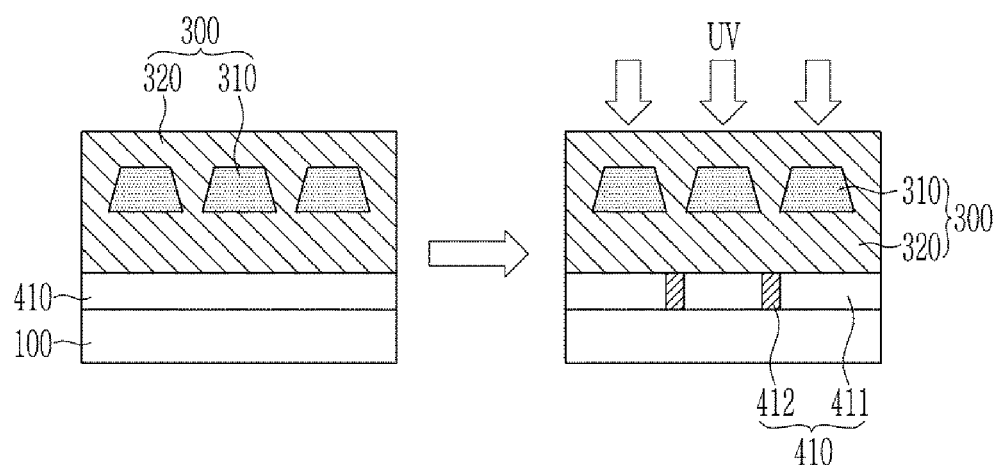
FIG. 7 illustrates a process of increasing a modulus of a second area of a first adhesive layer.

The increase of the modulus of the second area 412 may be obtained by UV irradiation using the metal layer 310 as a mask. FIG. 7 illustrates a process of increasing a modulus of the second area 412 of the first adhesive layer 410. Referring to FIG. 7, UV is irradiated from a lower portion of the supporter 300. In FIG. 7, a portion of the display part DP is illustrated, and for better understanding and ease of description, a state in which upper and lower portions thereof are reversed is illustrated.

As shown in FIG. 7, when the UV is irradiated from the lower portion of the supporter 300, a plurality of pre-formed metal layers 310 function as a mask. Accordingly, the UV may not reach the first area 411 of the first adhesive layer 410 overlapping the metal layer 310, and the UV is irradiated on only the second area 412 that does not overlap the metal layer 310.

The first adhesive layer 410 irradiated with the UV is cured by the UV. Therefore, as the second area 412 irradiated with the UV is cured, the modulus thereof may increase. A difference in modulus between the first area 411 and the second area 412 may be about 2 to 10 times. The modulus of the second area 412 may be about 2 to 10 times larger than that of the first area 411.

As described above, since the metal layer 310 may be used as a mask to cure a portion of the first adhesive layer 410, there is no need to make a separate mask, and thus a process may be streamlined and thus more economical. Since the area that does not overlap the metal layer 310 may be an area in which the deformation easily occurs, it is possible to prevent the deformation of the display part DP during the rolling process and to maintain the display quality, by increasing the strength of the area in which the deformation easily occurs.

In FIG. 4, the metal layer 310 is shown to have a substantially trapezoidal cross-sectional shape with an upper side longer than a lower side or other sides, but the shape of the metal layer 310 is not limited thereto.

FIG. 8 illustrates a similar schematic cross-sectional view as FIG. 4 for a display device according to an embodiment. Referring to FIG. 8, the display device according to an embodiment may be similar to that of FIG. 4 except for a schematic cross-sectional shape of the metal layer 310. Detailed description of the same constituent elements will be omitted.

Referring to FIG. 8, in the display device according to an embodiment, the metal layer 310 has a substantially trapezoidal cross-sectional shape with a lower side longer than an upper side. The cross-sectional shape of the metal layer 310 may be changed according to a direction in which the display portion DP may be rolled. In an embodiment of FIG. 8, the modulus of the second area 412 of the first adhesive layer 410, which may not overlap the surfaces of the metal layer 310 and the display panel 100 in a substantially vertical direction, may be higher than that of the first area 411 of the first adhesive layer 410, which overlaps the surfaces of the metal layer 310 and the display panel 100 in the substantially vertical direction.

FIG. 4 and FIG. 8 illustrate the shape in which the cross-sectional shape of the metal layer 310 may be trapezoidal, but the disclosure is not limited thereto, and the cross-sectional shape of the metal layer 310 may be variously changed. FIG. 9 illustrates a schematic cross-sectional view of an embodiment that illustrates a similar cross-section as in FIG. 4. Referring to FIG. 4 and FIG. 9, the display device according to an embodiment may be similar to that of FIG. 4 except for a cross-sectional shape of the metal layer 310. Detailed description of the same constituent elements will be omitted.

Referring to FIG. 9, in the display device according to an embodiment, the metal layer 310 has a substantially quadrangular cross-sectional shape. In an embodiment of FIG. 9, the modulus of the second area 412 of the first adhesive layer 410, which may not overlap the surfaces of the metal layer 310 and the display panel 100 in a substantially vertical direction, may be higher than that of the first area 411 of the first adhesive layer 410, which overlaps the surfaces of the metal layer 310 and the display panel 100 in the substantially vertical direction.

As described above, the display device according to an embodiment may be rollable, and may include a plurality of metal layers 310 spaced apart from each other for rolling, and a cushion layer 320 surrounding the metal layer 310. The modulus of the adhesive layer in the area not overlapping the metal layer 310 may be increased to prevent the deformation of the display part DP during the rolling process. This modulus increasing process may be performed by UV irradiation using the metal layer 310 as a mask, and it is economical because a separate mask is not added.

While this disclosure has been described in connection with what is considered to be practical embodiments, it is to be understood that the disclosure is not limited to the disclosed embodiments, but, on the contrary, is intended to cover various modifications and equivalent arrangements included within the spirit and scope of the appended claims and the disclosure.

What is claimed is:

1. A display device comprising:
a display panel;
a supporter disposed on a surface of the display panel; and
an adhesive layer disposed between the supporter and the display panel, wherein the supporter includes:
metal layers spaced apart from each other in a horizontal direction; and
a cushion layer surrounding the metal layers, wherein
a Young's modulus of the metal layers is larger than a Young's modulus of the cushion layer,
the adhesive layer includes:
a first area overlapping the metal layers in a vertical direction to the display panel; and
a second area not overlapping the metal layers in the vertical direction to the display panel, and
a Young's modulus of the second area of the adhesive layer is larger than a Young's modulus of the first area of the adhesive layer.

2. The display device of claim 1, wherein a difference between the Young's modulus of the second area and the Young's modulus of the first area is about 2 times to about 10 times.

3. The display device of claim 1, wherein the first area and the second area include a same material.

4. The display device of claim 1, wherein the metal layers include stainless steel, aluminum, or a carbon composite material.

5. The display device of claim 1, wherein a Young's modulus of the metal layers is in a range of about 1 GPa to about 1000 Gpa.

6. The display device of claim 1, wherein the cushion layer includes silicone or urethane.

7. The display device of claim 6, wherein a Young's modulus of the cushion layer is in a range of about 1 Kpa to about 1000 Kpa.

8. The display device of claim 1, wherein a cross-sectional shape of each of the metal layers in the vertical direction to the display panel is substantially quadrangular.

9. The display device of claim 8, wherein a cross-sectional shape of each of the metal layers in the vertical direction to the display panel is substantially trapezoidal in which a side positioned away from the display panel is longer than other sides.

10. The display device of claim 8, wherein a cross-sectional shape of each of the metal layers in the vertical direction to the display panel is substantially trapezoidal in which a side positioned closer to the display panel is longer than other sides.

11. The display device of claim 1, wherein a width of the second area of the adhesive layer is same as a shortest distance between adjacent ones of the metal layers.

12. The display device of claim 1, wherein the display panel is rollable.

13. The display device of claim 12, further comprising:
a roller on which the display panel is rolled; and
a housing part that accommodates the roller and the display panel rolled on the roller.

14. The display device of claim 1, wherein the adhesive layer is a pressure sensitive adhesive.

* * * * *